United States Patent [19]

Anami

[11] Patent Number: 5,784,318
[45] Date of Patent: Jul. 21, 1998

[54] METHOD OF PREPROGRAMMING BEFORE VERIFYING IN NON-VOLATILE MEMORY DEVICE AND APPARATUS FOR THE SAME

[75] Inventor: Hiroaki Anami, Kanagawa, Japan

[73] Assignee: NEC Corporation, Tokyo, Japan

[21] Appl. No.: 908,058

[22] Filed: Aug. 11, 1997

[30] Foreign Application Priority Data

Aug. 23, 1996 [JP] Japan ................................. 8-222242

[51] Int. Cl.⁶ ..................................................... G11C 16/06
[52] U.S. Cl. ............................ 365/185.22; 365/185.29; 365/185.33; 365/185.23
[58] Field of Search ..................... 365/185.22, 185.29, 365/185.33, 185.23

[56] References Cited

U.S. PATENT DOCUMENTS 5,361,227  11/1994  Tanaka et al. ........................ 365/18.22
5,379,256   1/1995  Tanaka et al. ................... 365/185.22 X
5,590,074  12/1996  Akaogi et al. ....................... 365/185.22

*Primary Examiner*—Huan Hoang
*Attorney, Agent, or Firm*—Foley & Lardner

[57] ABSTRACT

In a non-volatile semiconductor memory device, a memory cell array is composed of a plurality of memory cells. An address generating section sequentially generates an address from a head address to a last address for the memory cell array. A writing section performs a preprogramming operation to the memory cells of the memory cell array corresponding to the generated address. A verifying section performs a verifying operation to the memory cells of the cell array corresponding to the generated address. A detecting section detects a preprogramming operation period and a verifying operation period. A control section controls the writing section to be activated and the verifying section to be inactivated, during the preprogramming operation period, and controls the writing section to be inactivated and the verifying section to be activated, during the verifying operation period.

19 Claims, 8 Drawing Sheets

METHOD OF PREPROGRAMMING BEFORE VERIFYING IN NON-VOLATILE MEMORY DEVICE AND APPARATUS FOR THE SAME

BACKGROUND OF THE INVENTION

1. Field of the Invention

The present invention relates to an initializing method in a flash erasing type non-volatile memory device and an apparatus for the same, and more particularly to an initializing method in a flash erasing type non-volatile memory device and an apparatus for the same, in which a preprogramming operation is performed before a verifying operation.

2. Description of the Related Art

In a flash erasing type non-volatile memory (hereinafter, to be referred to as a flash memory device hereinafter), there is the following problem from the beginning of the development of the flash memory device. That is, a distribution of threshold voltages of memory cell transistors after an erasing operation is large and sometimes the memory cell transistors are over-erased. In order to prevent such a problem, the method is generally used in which the erasing operation is performed after a preprogramming operation and a verifying operation are repetitively performed in units of bytes. Such an erasing method is also described in a product catalog of such a flash memory device.

The structure of a control section for the preprogramming operation in a typical example of conventional flash memory device will be described below. FIG. 1 is a block diagram illustrating the structure of the control section for the preprogramming operation in the typical example of conventional flash memory device.

Referring to FIG. 1, the conventional flash memory device is composed of a memory cell array 1, a decoding section 2, an internal address generating circuit 3x, a writing circuit 4, a verifying circuit 5 and an internal sequence control section 6x.

The memory cell array 1 is composed of a plurality of memory cell transistors arranged in a matrix manner. The threshold voltage of each of the memory cell transistors can be set to a predetermined value. A data can be stored in the memory cell transistor by changing the threshold voltage of the memory cell transistor. The decoding section 2 designates the memory cell transistors in the memory cell array 1 in response to an internal address signal IAD from the internal address generating circuit 3x. The internal address generating circuit 3x sets the address value of the internal address signal IAD to the lowermost address value in response to a rising edge of a preprogramming and verifying operation period signal WVP. Also, the internal address generating circuit 3x sequentially updates or increases the address value of the internal address signal IAD in response to an address update control signal ADC. The internal address generating circuit 3x outputs an end address detection signal EAD when the updated address value reaches the uppermost address value. The writing circuit 4 performs a writing operation of a data into the memory cell array 1 in response to a preprogramming operation control signal PW and outputs a write end signal WED when a writing operation period is ended. The verifying circuit 5 performs a verifying operation of the data written in the memory cell array 1 in response to a verification control signal VF. The verifying circuit 5 also outputs a verification result signal VR and a verification end signal VED. The internal sequence control section 6x controls in a manner such that when an erasing mode is externally designated by an input/output signal I/O (IO0 to IO8), the preprogramming and verifying operation period signal WVP is set to the high level. In response to the write end signal WED, the internal sequence control section 6x sets the preprogramming operation control signal PW to an inactive level and outputs the verification control signal VF. Also, the internal sequence control section 6x set the verification control signal VF to the inactive level in response to the verification end signal VED. At this time, the internal sequence control section 6x outputs the address update control signal ADC, when the verification result signal VR indicates the good result of the preprogramming operation. On the other hand, the internal sequence control section 6x outputs the preprogramming operation control signal PW without outputting the address update control signal ADC, when the verifying operation result signal VR indicates of the defective result of the preprogramming operation. Further, the internal sequence control section 6x falls the preprogramming and verifying operation period signal WVP in response to the end address detection signal EAD unless the verifying operation indicates the defective result.

FIG. 2 is a circuit diagram illustrating the detailed structure of the internal sequence control section 6x. Referring to FIG. 2, the internal sequence control section 6x is composed of latch circuits L61 and L62, inverters IV61, IV62 and IV63, NAND gates NAG61, NAG62, NAG63, NAG64 and NAG65, an OR gate OG61x and an address update control circuit 61. The NAND gate NAG61 decodes the input signal I/O and detects an erasing mode. The inverter IV61 inverts the output level of the NAND gate NAG61. The OR gate OG61x performs an OR calculation of the verifying operation result signal VR, the output signal of the inverter IV61, and the address update control signal ADC. The latch circuit L61 is set in response to the output signal of the OR gate OG61x and reset in response to the write end signal WED, to output the preprogramming operation control signal PW. The inverter IV63 inverts the output signal of the latch circuit L61 in level. The latch circuit L2 is set in response to the output signal of the inverter IV63 and reset in response to the verification end signal VED, to output the verification control signal VF. The inverter IV62 inverts the verifying operation result signal VR in level. The NAND gate NAG62 performs an NAND calculation of the output signal of the inverter IV62, the end address detection signal EAD, and the output signal (VF) of the latch circuit L2. The NAND gates NAG64 and NAG65 forms a flip-flop circuit and the NAND gates NAG63 to NAG65 outputs the preprogramming and verifying operation period signal WVP from the output signal of the NAND gates NAG61 and the output signal of the NAND gate NAG62. The address update control circuit 61 outputs the address update control signal ADC from the output signal of the inverter IV62 and the output signal (VF) of the latch circuit L2.

Next, the operation of the preprogramming operation before the erasing operation in the conventional flash memory device will now be described with reference to a flowchart shown in FIGS. 4 and timing charts shown in FIGS. 3A to 3H.

First, in the internal sequence control section 6x, it is detected that the input/output signal I/O designates the erasing mode. The erasing mode is designated when all of the signals IO0 to IO8 are at the high level. In a step S1, the internal sequence control section 6x sets the preprogramming and verifying operation period signal WVP to the H level, as shown in FIG. 3A. As a result, the preprogramming operation is started. In response to the rising edge of the preprogramming and verifying operation period signal WVP, in a step S2, the internal address generating circuit 3x sets the address value of the internal address signal IAD to the lowermost address (IAD=0).

Subsequently, the preprogramming operation control signal PW is set to the active level (high level), as shown in FIG. 3B. In a step S3, the preprogramming operation for the lowermost address is executed. After completion of the preprogramming operation for the lowermost address, the write end signal WED is generated so that the preprogramming operation control signal PW is reset, as shown in FIG. 3B. In response to this, the verification control signal VF is set to the active level, as shown in FIG. 3D, and, in a step S7, a verifying operation is executed to the memory cell transistors to which the preprogramming operation is performed in the step S3.

In a step S8, the verifying operation result is determined. If the verifying operation result indicates a defective state, the verifying operation result signal VR is set to the high level, as shown in FIG. 3F. In this case, the internal sequence control circuit 6x generates the preprogramming operation control signal PW in a step S9 to output to the writing circuit 4, as shown in FIG. 3B. The writing circuit 4 performs the preprogramming operation to the same memory cell transistors in the memory cell array without increasing the address value. Then, the step S7 is executed again.

On the other hand, if the verifying operation result is good, the verification result signal VR is left in the low level by the verifying circuit 5 to indicate that the verifying operation result is good. When the verifying operation result is good (OK), it is determined in a step S10 whether the current address is the uppermost address. In this case, since the current address is not the uppermost address, the end detection signal EAD has been left in the low level in the step S10, as shown in FIG. 3H. Therefore, the address update control signal ADC is outputted from the internal sequence control signal 6x, as shown in FIG. 3G. The internal address (IAD) is updated to the next address (=1) in a step S11. Then, the reprogramming operation of the step S3 and the verifying operation of the steps S7 and S8 for the updated address are repeated.

When the address is set to the uppermost address, namely, when the preprogramming operation and the verifying operation are ended for all of the addresses, the end address detection signal EAD is generated from the internal address generating circuit 3x, in the step S12, as shown in FIG. 3H. Subsequently, the preprogramming and verifying operation period signal WVP is reset to the low level, as shown in FIG. 3A. As a result, the preprogramming and verifying operation period is ended. Finally, the erasing operation is started in a step S12.

According to the conventional flash memory device, if it is assumed that a memory capacity is 1 Mbits and the number of bits of parallel input/output data is 8 bits, a switching operation between the preprogramming operation and the verifying operation is performed 128,000 times at least. Because a switching time per switching operation is about 0.5 μs, a total time of 64,000 μs is needed at least.

In this manner, in the conventional flash memory device, the preprogramming operation and the verifying operation is executed to each of the addresses. For this reason, there is a problem in that the required switching time between the preprogramming operation and the verifying operation increases in proportion to the memory capacity so that it takes a long time until the end of the erasing operation.

SUMMARY OF THE INVENTION

The present invention is made in the view of the above-mentioned circumstances. Therefore, an object of the present invention is to provide an initializing method in a flash erasing type non-volatile semiconductor memory device and an apparatus for the same, in which a time required for an initializing operation can be reduced.

In order to achieve an aspect of the present invention, a non-volatile semiconductor memory device includes a memory cell array composed of a plurality of memory cells, an address generating section for sequentially generating an address from a head address to a last address for the memory cell array, a writing section for performing a preprogramming operation to the memory cells of the memory cell array corresponding to the generated address, a verifying section for performing a verifying operation to the memory cells of the cell array corresponding to the generated address, a detecting section for detecting a preprogramming operation period and a verifying operation period, and a control section for controlling the writing section to be activated and the verifying section to be inactivated, during the preprogramming operation period, and for controlling the writing section to be inactivated and the verifying section to be activated, during the verifying operation period.

When the control section generates a preprogramming and verifying operation period signal and repeatedly generates an address update signal, the address generating section generates the head address in response to the preprogramming and verifying operation period signal, updates the address from the head address to the last address twice in response to the address update signals, and generates a first address end signal and a second address end signal when the updated address reaches the last address. In this case, the detecting section detects the preprogramming operation period based on the preprogramming and verifying operation period signal and the first address end signal, and detects the verifying operation period based on the preprogramming and verifying operation period signal and the first and second address end signals. Further, the detecting section includes a flip-flop circuit which is set in response to activation of the preprogramming and verifying operation period signal and reset in response to the first address end signal.

The verifying section may perform the verifying operation to the memory cells corresponding to the generated address in response to a verifying operation execution signal, and may generate a verifying operation end signal and a verifying operation result signal indicating a result of the verifying operation. In this case, the control section desirably issues the verifying operation execution signal to the verifying section and the address update signal to the address generating section during the verifying operation period in response to the verifying operation end signal when the verifying operation result signal indicates that the verify operation result is good. Also, the control section desirably controls the writing section to be activated without issuing the address update signal during the verifying operation period when the verifying operation result signal indicates that the verifying operation result is not good, and then issues the verifying operation execution signal to the verifying section without issuing the address update signal to the address generating section in response to a preprogramming operation end signal from the writing section. In this case, the control section includes an address update signal generating circuit for generating the address update signal in response to the verifying operation execution signal and selectively stops the generation of the address update signal in response to the verifying operation result signal, a first section for setting the verifying operation execution signal in response to the address update signal, and resetting the verifying operation execution signal in response to the verifying operation end signal, whereby the verifying operation execution signal is generated, and a second section for setting a preprogramming operation execution signal in response to the verifying operation result signal and resetting the preprogramming operation execution signal in response to the preprogramming operation end signal, whereby the preprogramming operation execution signal is generated.

In order to achieve another aspect of the present invention, a method of initializing a non-volatile semiconductor memory device, includes the steps of:

sequentially generating an address from a head address to a last address for a memory cell array composed of a plurality of memory cells;

performing a preprogramming operation to the memory cells of the memory cell array corresponding to the generated address;

performing a verifying operation to the memory cells of the cell array corresponding to the generated address;

detecting a preprogramming operation period and a verifying operation period;

controlling the writing step to be activated and the verifying step to be inactivated, during the preprogramming operation period; and controlling the writing step to be inactivated and the verifying step to be activated, during the verifying operation period.

In order to achieve still another aspect of the present invention, a non-volatile semiconductor memory device includes a memory cell array composed of a plurality of memory cells, an address generating section for generating an initial address as an address in response to an address generation signal, for updating the address in response to an address update signal and the address generation signal, and for generating an address end signal when the updated address is equal to a final address, wherein each of the generated addresses designate the memory cells of the memory cell array, a writing section for performing a preprogramming operation to the designated memory cells in response to a preprogramming operation execution signal, a verifying section for performing a verifying operation to the designated address in response to a verifying operation execution signal, to generate a verifying operation result signal indicating the verifying operation result, a period detecting section for detecting a preprogramming operation period in response to the address generation start signal and the address end signal, and a control section for issuing the address generation signal to the address generating section and the period detecting section, and for repeatedly issuing the preprogramming operation execution signal to the writing section, while repeatedly issuing the address update signal to the address generating section, in a state in which issuance of the verifying operation execution signal to the verifying section is inhibited during the preprogramming operation period.

DESCRIPTION OF THE PREFERRED EMBODIMENTS

A non-volatile semiconductor memory device such as a flash memory device of the present invention will now be described with reference to the accompanying drawings.

Figure 1:
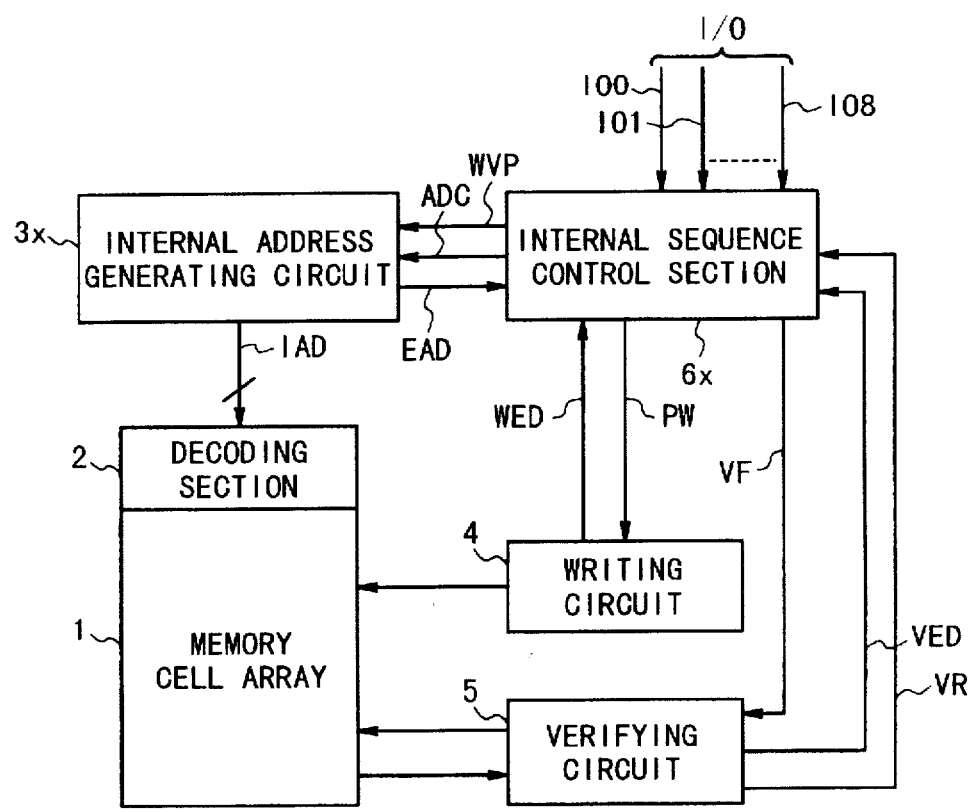
FIG. 1 is a block diagram illustrating the structure of a conventional flash memory device.
Figure 2:
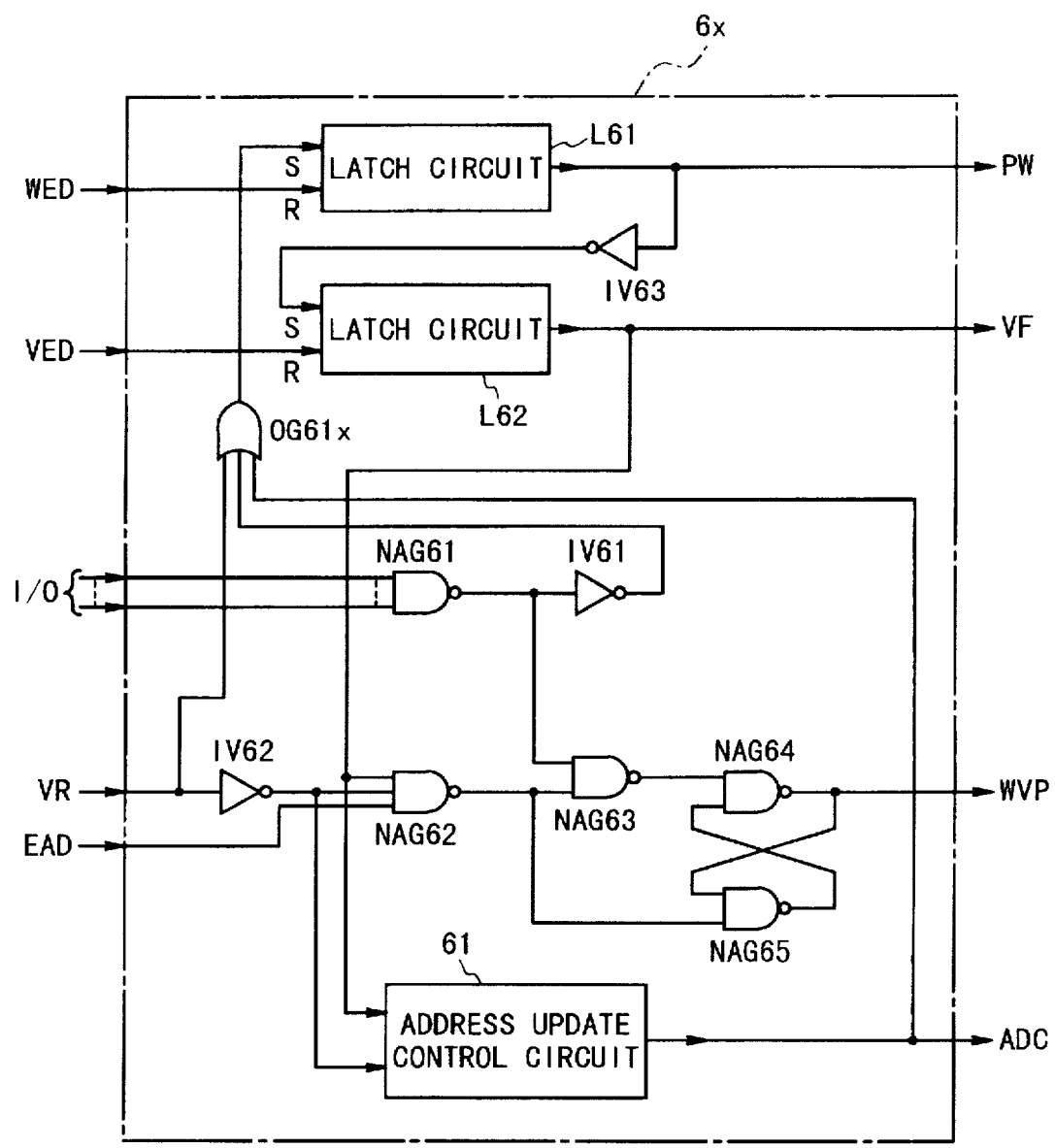
FIG. 2 is a circuit diagram illustrating the structure of an internal sequence control section of the conventional flash memory device shown in FIG. 1.
Figure 3:
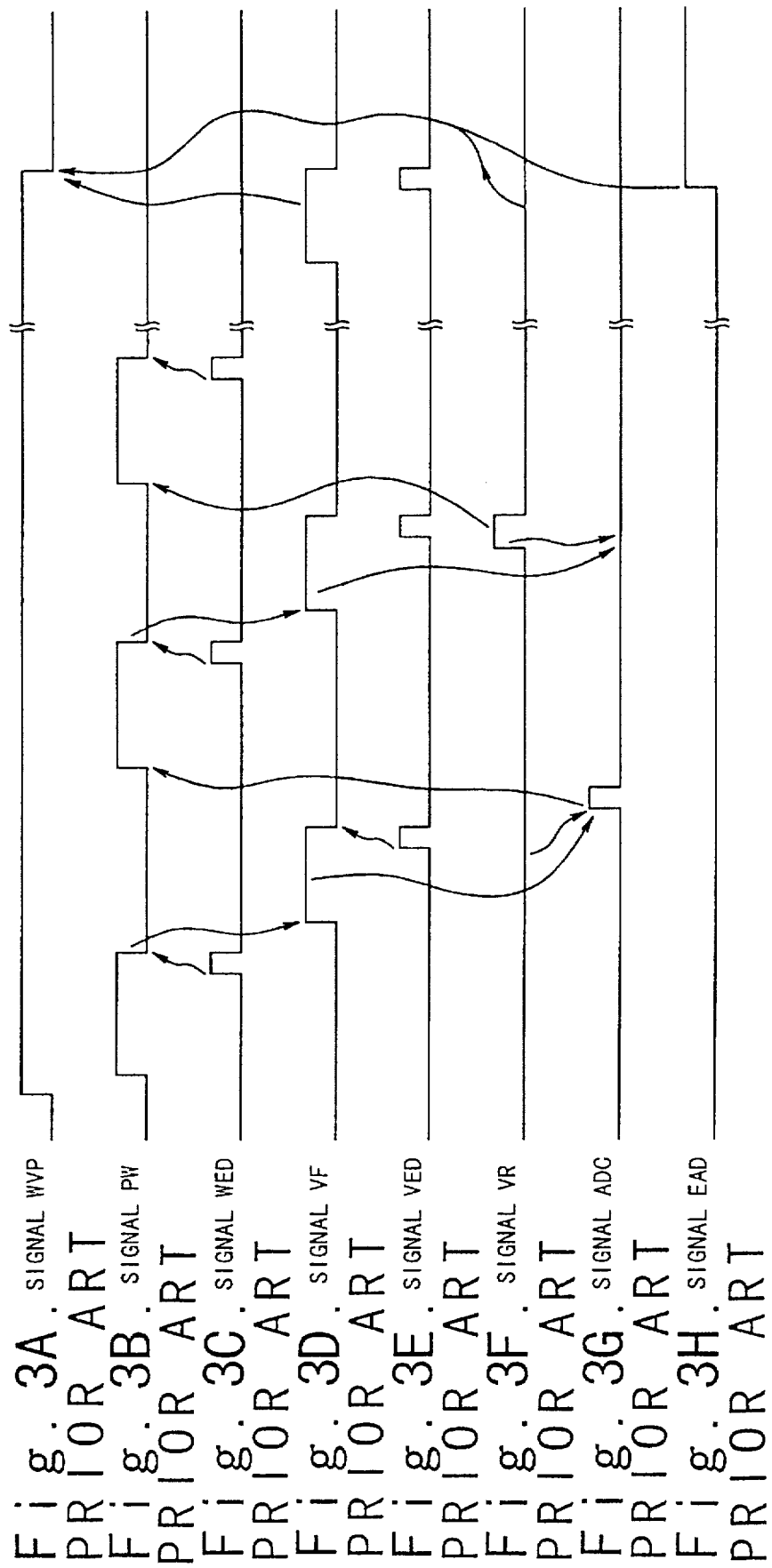
FIGS. 3A to 3H are timing charts of various signals for explaining the operation of the conventional flash memory device.
Figure 4:
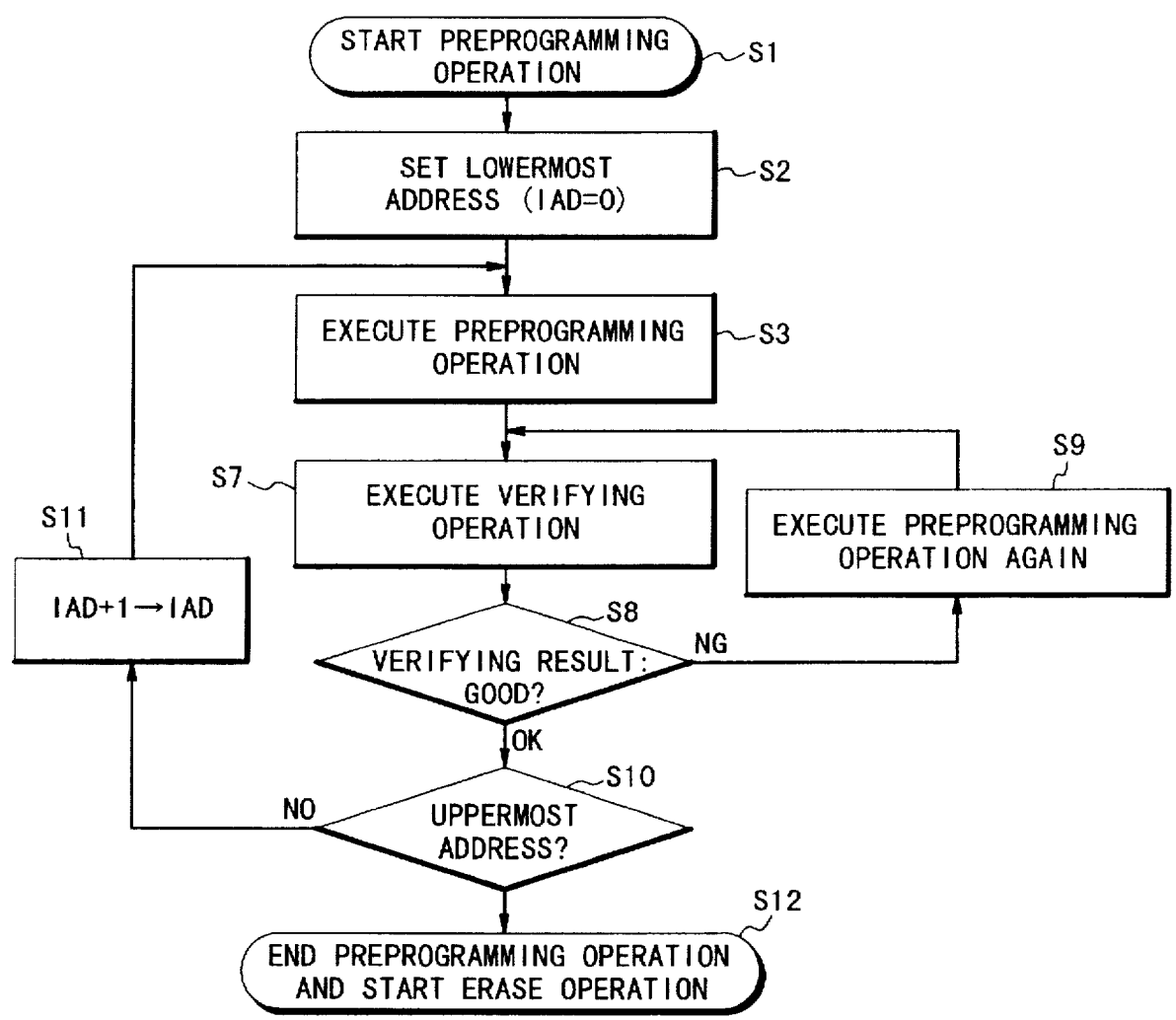
FIG. 4 is a flow chart to describe the operation of the conventional flash memory device.
Figure 5:
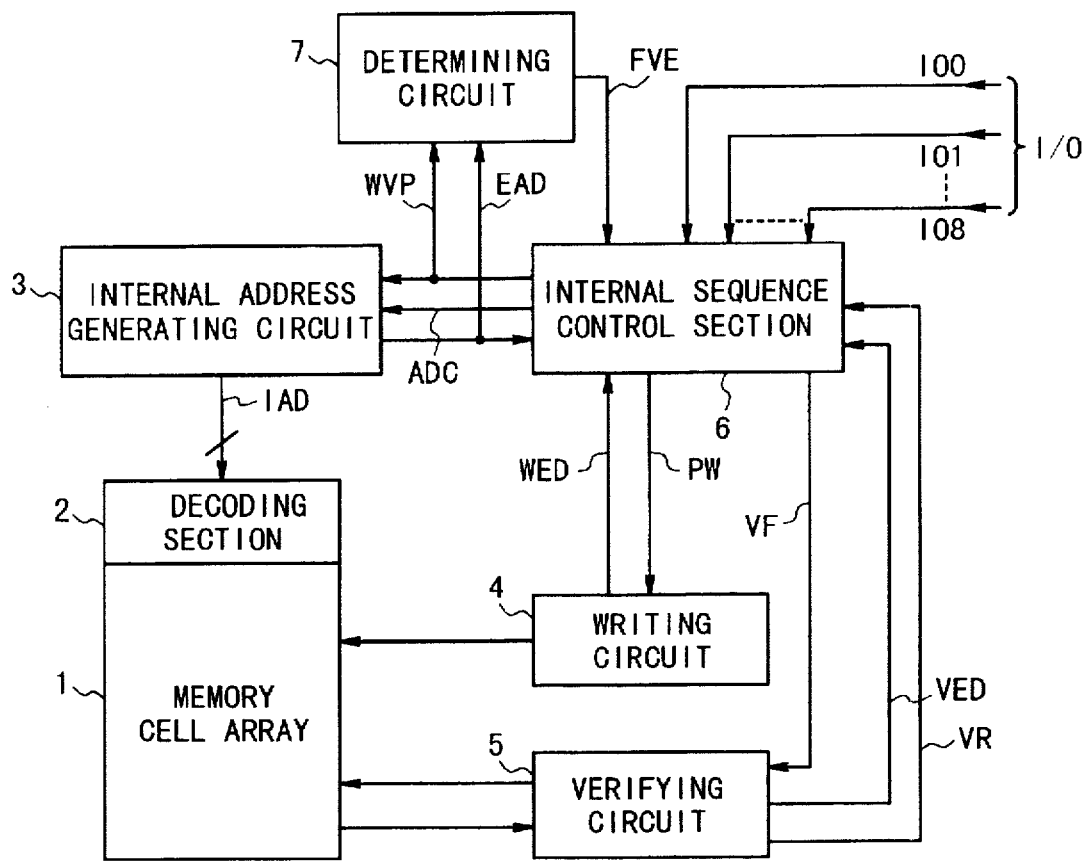
FIG. 5 is a block diagram illustrating the structure of a flash memory device according to an embodiment of the present invention.

FIG. 5 is a block diagram illustrating an initializing operation control portion of a non-volatile semiconductor memory device (hereinafter, referred to as a "flash memory device") according to an embodiment of the present invention.

Referring to FIG. 5, the flash memory device in the embodiment is composed of a memory cell array 1, a decoding section 2, an internal address generating circuit 3, a writing circuit 4, a verify circuit 5, an internal sequence control section 6 and a determining circuit 7.

The memory cell array 1 is composed of a plurality of memory cell transistors arranged in a matrix manner. The threshold voltage of each of the memory cell transistors can be set to a predetermined value. A data can be stored in the memory cell transistor by changing the threshold voltage of the memory cell transistor. The decoding section 2 designates the address for memory cell transistors in the memory cell array 1 in response to an internal address signal IAD from the internal address generating circuit 3. The internal address generating circuit 3 sets the address value of the internal address signal IAD to the lowermost address value in response to a rising edge of a preprogramming and verifying operation period signal WVP. Also, the internal address generating circuit 3 sequentially updates or increases the address value of the internal address signal IAD in response to an address update control signal ADC. Further, the internal address generating circuit 3 outputs an end address detection signal EAD when the updated address value reaches the uppermost address value. The writing circuit 4 performs a preprogramming operation of a data to the memory cell array 1 in response to a preprogramming operation control signal PW and outputs a write end signal WED when a preprogramming operation period is ended. The verifying circuit 5 performs a verifying operation of the data written in the memory cell array 1 in response to a verifying operation control signal VF. The verifying circuit 5 also outputs a verifying operation result signal VR and a verifying operation end signal VED.

The internal sequence control section 6 controls in a manner such that when an erasing mode is externally designated by an input/output signal I/O (IO0 to IO8), the preprogramming and verifying operation period signal WVP is set to the high level. In response to the write operation end signal WED, the internal sequence control section 6 resets the preprogramming operation control signal PW to an inactive level and outputs the verifying operation control signal VF. Also, the internal sequence control section 6x reset the verifying operation control signal VF to the inactive level in response to the verifying operation end signal VED. At this time, the internal sequence control section 6x outputs the address update control signal ADC, when the verifying operation result signal VR indicates the good result of the preprogramming operation. On the other hand, the internal sequence control section 6x outputs the preprogramming operation control signal PW without outputting the address update control signal ADC, when the verifying operation result signal VR indicates of the defective result of the preprogramming operation. Further, the internal sequence control section 6x falls the preprogramming and verifying operation period signal WVP in response to the end address detection signal EAD unless the verifying operation indicates the defective result.

The determining circuit 7 receives the preprogramming and verifying operation period signal WVP and the end address detection signal EAD to generate a first verifying operation period signal FVE.

Figure 6:
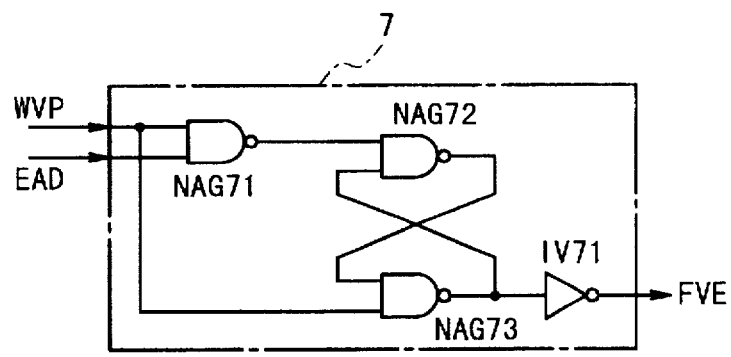
FIG. 6 is a circuit diagram illustrating the structure of a determining circuit of the flash memory device in the embodiment.

Next, FIG. 6 is a circuit diagram illustrating the structure of the determining circuit 7. Referring to FIG. 6, the determining circuit 7 is composed of NAND gates NAG71, NAG72 and NAG73 and an inverter IV71. The NAND gates NAG72 and NAG73 forms a flip-flop circuit. The preprogramming and verifying operation period signal WVP and the end address detection signal EAD are inputted to the NAND gate NAG71 whose output is supplied to the NAND gate NAG72 of the flip-flop circuit. The preprogramming and verifying operation period signal WVP is supplied to the NAND gate NAG73 of the flip-flop circuit. The output of the NAND gate NAG73 is connected to the inverter IV71.

Figure 7:
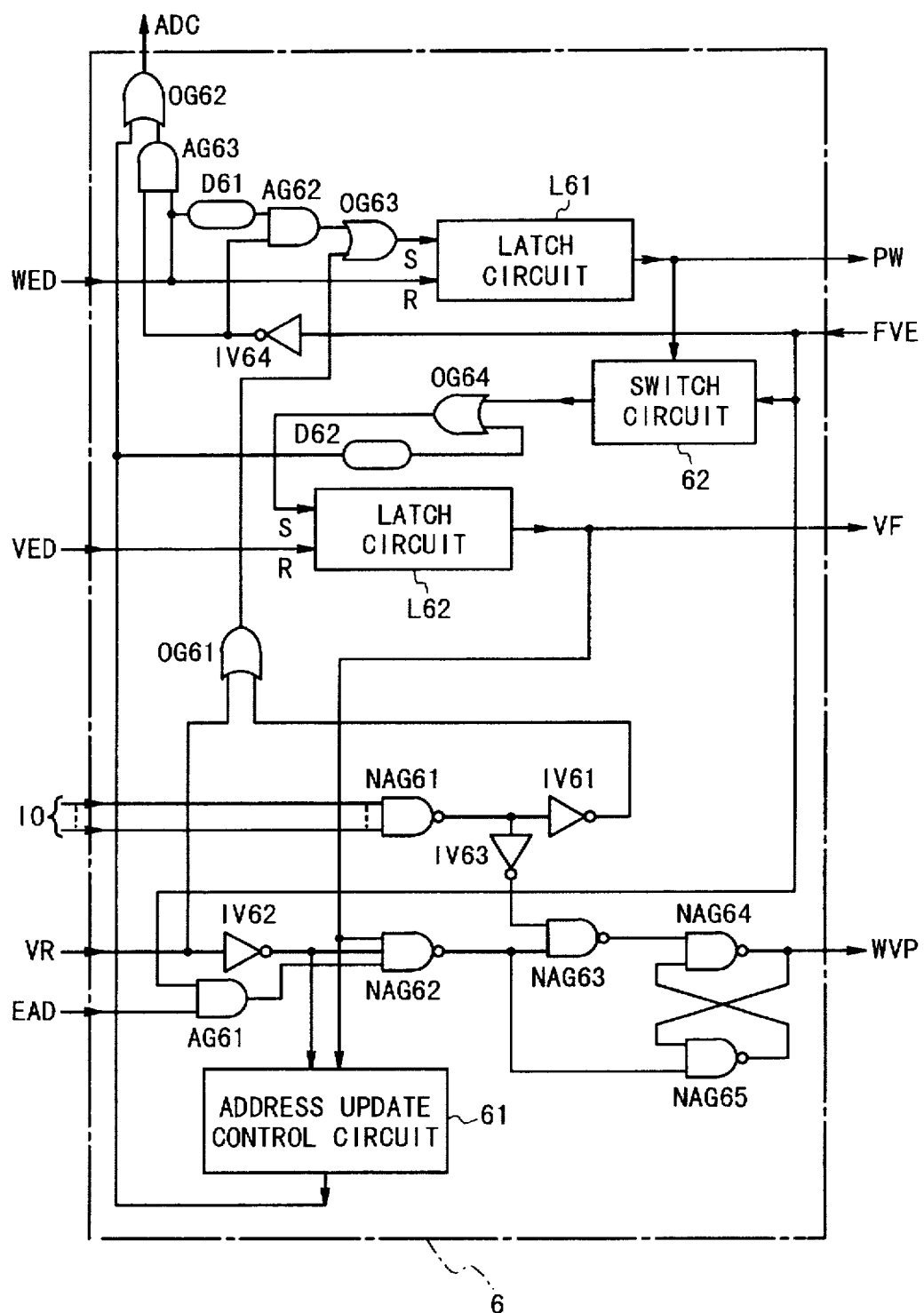
FIG. 7 is a circuit diagram illustrating the structure of an internal sequence control section of the flash memory device shown in FIG. 5.

FIG. 7 is a circuit diagram illustrating the detailed structure of the internal sequence control section 6. Referring to FIG. 7, the internal sequence control section 6 is composed of latch circuits L61 and L62, inverters IV61, IV62, IV63 and IV64, NAND gates NAG61, NAG62, NAG63, NAG64 and NAG65, AND gates AG61, AG62 and AG63, OR gates OG61, OG62, OG63 and OG64, delay circuits D61 and D62, a switch circuit 62 and an address update control circuit 61. The NAND gate NAG61 decodes the input signal I/O and detects an erasing mode. The inverter IV61 inverts the output level of the NAND gate NAG61. The inverter IV 62 inverts the verifying operation result signal VR. The AND gate AG 61 calculates a logical product of the end address detection signal EAD and the first verifying operation period signal FVE. The NAND gate NAG62 calculates a logical product of the verifying operation control signal VF, the output signal of the inverter IV62 and the output signal of the AND gate AG61 and inverts the logical product. The NAND gate NAG 63 calculates a logical product of the output signal of the inverter IV63 and the output signal of the NAND gate NAG62 and inverts the logical product. The NAND gate NAG63 calculates a logical product of the output signal of the inverter IV63 and the output signal of the NAND gate NAG62 and inverts the logical product. The NAND gates NAG64 and NAG65 forms a flip-flop circuit and the flip-flop circuit outputs the reprogramming and verifying operation period signal VP from the output signal of the NAND gates NAG63 and the output signal of the NAND gate NAG62.

The OR gate OG61 performs an OR calculation of the verifying operation result signal VR, and the output signal of the inverter IV61. The address update control circuit 61 outputs a signal from the output signal of the inverter IV62 and the output signal VF of the latch circuit L62. The first verifying operation period signal FVE is inverted by the inverter IV64. The AND gate AG62 calculates a logical product of a delayed signal of the write end signal WED by the delay circuit D61 and the output signal of the inverter IV64. The AND gate AG63 calculates a logical product of the write end signal WED and the output signal of the inverter IV64. The OR gate OG62 outputs the address update control signal ADC from the output signal of the address update control circuit 61 and the output signal of the AND gate AG63.

The OR gate OG63 calculates a logical OR of the output signal of the OR gate OG61 and the output signal of the AND gate AG62. The latch circuit L61 is set in response to the output signal of the OR gate OG63 and reset in response to the write end signal WED, to output the preprogramming operation control signal PW.

The switch circuit 62 receives the first verifying operation period signal FVE and the preprogramming operation control signal PW. The switch circuit 62 controls such that the preprogramming operation control signal PW is not outputted from the switch circuit 62 while the first verifying operation period signal FVE is inactive. Also, the switch circuit 62 controls such that the preprogramming operation control signal PW is outputted from the switch circuit 62 while the first verifying operation period signal FVE is active.

The output signal of the address update control circuit 61 is delayed by the delay circuit D62. The OR gate OG64 calculates a logical sum of the output signal of the switch circuit 62 and the delayed signal by the delay circuit D62. The latch circuit L62 is set in response to the output signal of the OR gate OG64 and reset in response to the verifying operation end signal VED, to output the verification control signal VF.

Figure 8:
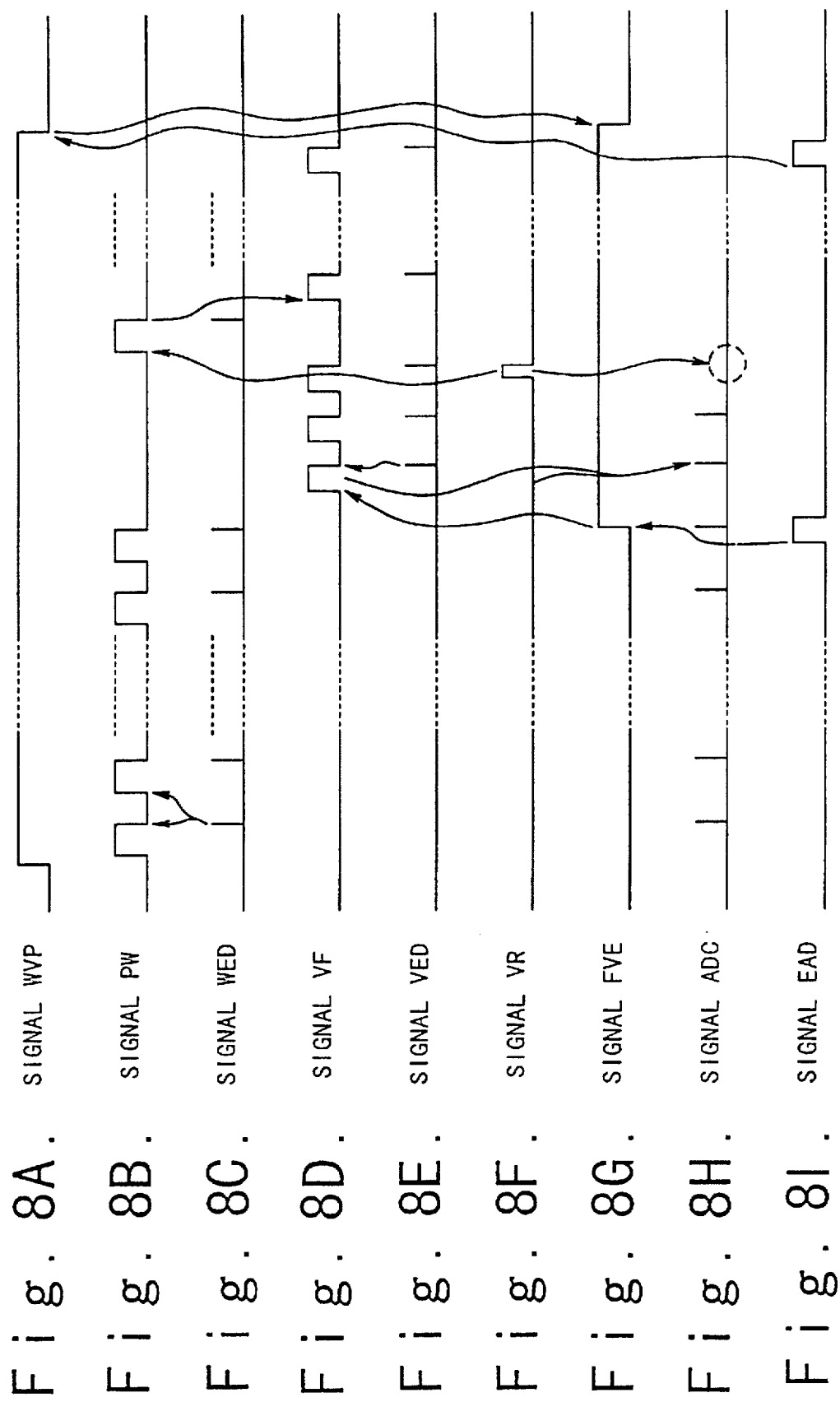
FIGS. 8A to 8I are timing charts of various signals for explaining the operation of the flash memory device of the present invention.
Figure 9:
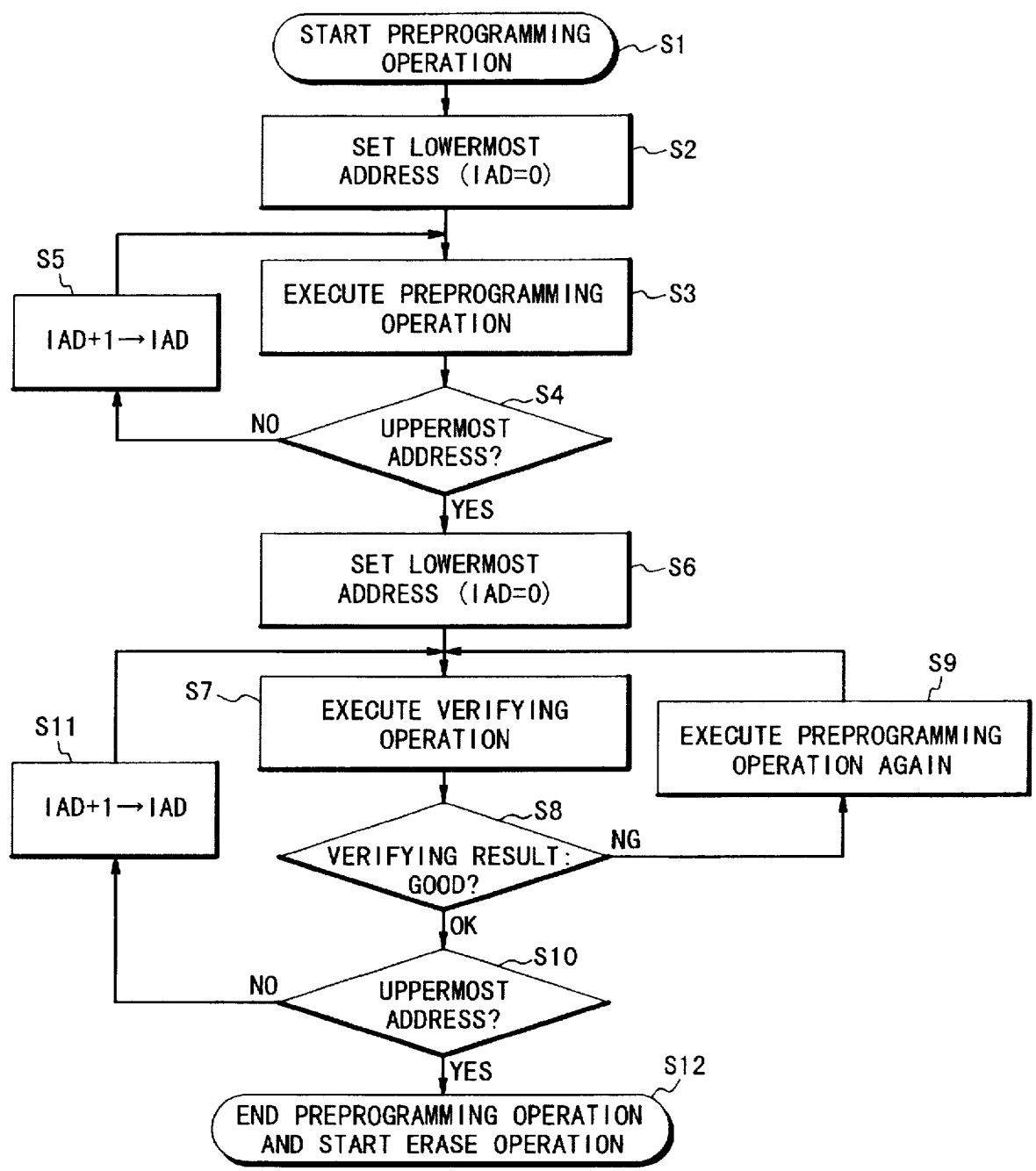
FIG. 9 is a flow chart to describe the operation of the flash memory device of the present invention.

Next, the operation of the initializing operation in the flash memory device of the embodiment will now be described with reference to a flow chart shown in FIGS. 9 and timing charts shown in FIGS. 8A to 8L.

First, in order to designate an erasing mode, the input/output signal I/O is set to the high level in a step S1. In the internal sequence control circuit 6, the input/output signal I/O is decoded by the NAND gate NAG61. Since the verifying operation control signal VF, the verifying operation result signal VR, the first verifying operation period signal FVE and the end address detection signal EAD are all set to the low level, as shown in FIGS. 8D, 8F, 8G and 8I, the output signal of the NAND gate NAG62 is in the high level. Therefore, the output signal of the NAND gate NAG63 is in the low level. In this manner, the preprogramming and verifying operation period signal WVP is set to the high level as shown in FIG. 8A.

In a step S2, the address value of the internal address signal IAD is set to the lowermost address (IAD=0) in the internal address generating circuit 3 in response to the rising edge of the preprogramming and verifying operation period signal WVP.

In a step S3, the output signal of the NAND gate NAG61 is supplied to the set terminal of the latch circuit L61 via the inverter IV61 and the OR gates OG61 and OG63. As a result, the preprogramming operation control signal PW is set to the high level, as shown in FIG. 8B. In this manner, the preprogramming operation is executed to the memory cell transistors having the address (IAD=0). When the preprogramming operation is ended, the writing circuit 4 generates the write end signal WED, as shown in FIG. 8C. The latch circuit L61 is reset in response to the write end signal WED, so that the reprogramming operation control signal PW is also reset, as shown in FIG. 8B.

In a step S4, whether the current address is the uppermost address is determined in the internal address generating circuit 3. Since the current address is not the uppermost in this case, the end address detection signal is left in the low level, as shown in FIG. 8I.

In a step S5, since the first verifying operation signal FVE is in the low level as shown in FIG. 8G, the write end signal WED is outputted from the OR gate OG62 as the address update control signal ADC via the AND gate AG63, as shown in FIG. 8H. The internal address generating circuit 3 updates the address value in response to the address update control signal ADC to generate the internal address signal IAD for the next address. In this case, the address update control circuit 61 does not generate the address update control signal when the first verifying operation period signal FVE is in the low level. After that, the step S3 is executed again.

When it is determined in the step S4 that the current address is the uppermost address, the end address detection signal EAD is generated by the internal address generating circuit 3, as shown in FIG. 8I. In the determining circuit 7, the first verifying operation period signal FVE is set to the active level (high level) in response to the end address detection signal, as shown in FIG. 8G. Then, a step S6 is executed.

In the step S6, the internal address generating circuit 3 resets the current address to the lowermost address (IAD=0) in response to the end address detection signal EAD.

In a step S7, a pulse signal is outputted from the switch circuit 62. The latch circuit L62 is set in response to the pulse signal to output the verifying operation control signal VF as shown in FIG. 8D. The verifying circuit 5 executes the verifying operation to the memory cell transistors designated by the current address IAD. When the verifying operation is ended, the verifying circuit 5 generates the verifying operation end signal VED as shown in FIG. 8E. The latch circuit L62 is reset in response to the verifying operation end signal VED, and the verifying operation control signal VF is also reset as shown in FIG. 8D.

In a step S8, the verifying circuit 5 determines whether the verifying operation result is good. If the verifying operation result is not good, the verifying circuit 5 outputs the verifying operation result signal VR of the high level, as shown in FIG. 8F. In the internal sequence control section 6, the verifying operation result signal VR is supplied to the address update control circuit 61 via the inverter IV62. The address update control circuit 61 stops the generation of the address update control signal ADC for the next preprogramming operation, as shown in FIG. 8H. Also, the latch circuit L61 is set in response to the verifying operation result signal VR supplied via the OR gates OG61 and OG63 to generate the preprogramming operation control signal PW as shown in FIG. 8B.

In a step S9, the writing circuit 4 performs the preprogramming operation to the memory cell transistors in the memory cell array 1 whose address is not updated, i.e., which are not good in the verifying operation result. When the preprogramming operation is ended, the write end signal is generated as shown in FIG. 8C, and the latch circuit L61 is reset as shown in FIG. 8B.

In the step S7, the latch circuit L62 is set in response to the preprogramming operation control signal PW to generate the verifying operation control signal VF as shown in FIG. 8D. The verifying operation is executed by the verifying circuit 5 in response to the verifying operation control signal. The signal VF is also supplied to the address update control circuit 61 to allow the generation of the address update control signal.

In the step S8, the verifying operation result is determined as described above. If the verifying operation result is good, the verifying operation result signal VR is left in the low level as shown in FIG. 8F.

In a step S10, it is determined whether the current address is the uppermost address of the memory cell array 1, as in the step S4. If the answer is NO, a step S11 is executed.

In a step S11, the address update control signal ADC is generated and supplied to the internal address generating circuit 3. The internal address generating circuit 3 updates the address in response to the address update control signal to supply the updated address to the decoding section 2. Then, the steps S7 to S9 are executed.

In the step S10, it is determined that the current address is the uppermost address, the internal address generating circuit 3 generates the end address detection signal EAD. The first verifying operation period signal FVE is reset in the determining circuit 7 in response to the end address detection signal EAD, as shown in FIG. 8G. Also, the preprogramming and verifying operation period signal WVP is reset in the internal sequence control section 6 in response to the end address detection signal EAD, as shown in FIG. 8A. Thus, the preprogramming operation is first performed and then the verifying operation is performed.

As described above, according to the present invention, after the preprogramming operation is performed for the memory cell transistors of all addresses in the memory cell array 1, the verifying operation is executed all the memory cell transistors. The preprogramming operation and the verifying operation are executed to only the memory cell transistors of the address in which the verifying operation result is not good. Therefore, as compared with the conventional method of repeating a pair of preprogramming operation and verifying operation for every address, the number of switching times between the preprogramming operation and the verifying operation can be remarkably reduced. Also, the time required for the preprogramming operation and the verifying operation can be reduced, so that the total time required for the initialization can be reduced.

In the conventional method, for example, if it is assumed that the memory capacity is equal to 1 Mbits, a time of 64000 μs is required at least, since the switching time between the preprogramming operation and the verifying operation is equal to about 0.5 μs per switching operation, in case of the 8-bit parallel inputs/outputs. However, according to the present invention, a time of 0.5 μs is only necessary, so that the total time required until the end of the erasing operation is shortened.

What is claimed is:

1. A non-volatile semiconductor memory device comprising:

a memory cell array composed of a plurality of memory cells;

an address generating section for sequentially generating an address from a head address to a last address for said memory cell array;

a writing section for performing a preprogramming operation to the memory cells of said memory cell array corresponding to the generated address;

a verifying section for performing a verifying operation to the memory cells of said cell array corresponding to the generated address;

a detecting section for detecting a preprogramming operation period and a verifying operation period; and a control section for controlling said writing section to be activated and said verifying section to be inactivated, during said preprogramming operation period, and for controlling said writing section to be inactivated and said verifying section to be activated, during said verifying operation period.

2. A non-volatile semiconductor memory device according to claim 1, wherein said control section generates a preprogramming and verifying operation period signal and repeatedly generates an address update signal, and wherein said address generating section generates the head address, updates the address from the head address to the last address twice in response to said address update signals, and generates a first address end signal and a second address end signal when the updated address reaches the last address.

3. A non-volatile semiconductor memory device according to claim 2, wherein said detecting section detects said preprogramming operation period based on said preprogramming and verifying operation period signal and said first address end signal, and detects said verifying operation period based on said preprogramming and verifying operation period signal and said first and second address end signals.

4. A non-volatile semiconductor memory device according to claim 3, wherein said detecting section includes a flip-flop circuit which is set in response to said first address end signal and reset in response to activation of said preprogramming and verifying operation period signal.

5. A non-volatile semiconductor memory device according to claim 1, wherein said verifying section performs said verifying operation to the memory cells corresponding to the generated address in response to a verifying operation execution signal, and generates a verifying operation end signal and a verifying operation result signal indicating a result of the verifying operation, and wherein said control section issues said verifying operation execution signal to said verifying section and said address update signal to said address generating section during said verifying operation period in response to said verifying operation end signal when said verifying operation result signal indicates that the verify operation result is good.

6. A non-volatile semiconductor memory device according to claim 5, wherein said control section controls said writing section to be activated without issuing said address update signal during said verifying operation period when said verifying operation result signal indicates that the verifying operation result is not good, and then issues said verifying operation execution signal to said verifying section without issuing said address update signal to said address generating section in response to a preprogramming operation end signal from said writing section.

7. A non-volatile semiconductor memory device according to claim 6, wherein said control section includes:

an address update signal generating circuit for generating said address update signal in response to said verifying operation execution signal and selectively stops the generation of said address update signal in response to said verifying operation result signal during the verifying operation period;

a first section for setting said verifying operation execution signal in response to said address update signal or a preprogramming execution signal during the verifying operation period, and resetting said verifying operation execution signal in response to said verifying operation end signal, whereby said verifying operation execution signal is generated; and a second section for setting said preprogramming operation execution signal in response to said verifying operation result signal and resetting said preprogramming operation execution signal in response to said preprogramming operation end signal, whereby said preprogramming operation execution signal is generated during the verifying operation period.

8. A method of initializing a non-volatile semiconductor memory device, comprising the steps of:

sequentially generating an address from a head address to a last address for a memory cell array composed of a plurality of memory cells;

performing a preprogramming operation to the memory cells of said memory cell array corresponding to the generated address;

performing a verifying operation to the memory cells of said cell array corresponding to the generated address;

detecting a preprogramming operation period and a verifying operation period;

controlling said writing step to be activated and said verifying step to be inactivated, during said preprogramming operation period; and controlling said writing step to be inactivated and said verifying step to be activated, during said verifying operation period.

9. A method according to claim 8, wherein said controlling step includes:

generating a preprogramming and verifying operation period signal; and repeatedly generating an address update signal, and wherein said step of sequentially generating an address includes:

generating the head address in response to said preprogramming and verifying operation period signal;

updating the address from the head address to the last address twice in response to said address update signals; and generating a first address end signal and a second address end signal when the updated address reaches the last address.

10. A method according to claim 9, wherein said detecting step includes detecting said preprogramming operation period based on said preprogramming and verifying operation period signal and said first address end signal; and detecting said verifying operation period based on said preprogramming and verifying operation period signal and said first and second address end signals.

11. A method according to claim 8, wherein said verifying step includes:

performing said verifying operation to the memory cells corresponding to the generated address in response to a verifying operation execution signal; and generating a verifying operation end signal and a verifying operation result signal indicating a result of the verifying operation, and wherein said controlling step includes:

issuing said verifying operation execution signal and said address update signal during said verifying operation period in response to said verifying operation end signal when said verifying operation result signal indicates that the verifying operation result is good.

12. A method according to claim 11, wherein said controlling step includes:
controlling said writing step to be activated without issuing said address update signal during said verifying operation period when said verifying operation result signal indicates that the verifying operation result is not good; and
issuing said verifying operation execution signal without issuing said address update signal to said address generating section in response to a preprogramming end signal from said writing section.

13. A non-volatile semiconductor memory device comprising:
a memory cell array composed of a plurality of memory cells;
an address generating section for generating an initial address as an address in response to an address generation signal, for updating the address in response to an address update signal and said address generation signal, and for generating an address end signal when the updated address is equal to a final address, wherein each of the generated addresses designate the memory cells of said memory cell array;
a writing section for performing a preprogramming operation to said designated memory cells in response to a preprogramming operation execution signal;
a verifying section for performing a verifying operation to said designated address in response to a verifying operation execution signal, to generate a verifying operation result signal indicating the verifying operation result;
a period detecting section for detecting a preprogramming operation period in response to said address generation start signal and said address end signal; and
a control section for issuing said address generation signal to said address generating section and said period detecting section, and for repeatedly issuing said preprogramming operation execution signal to said writing section, while repeatedly issuing said address update signal to said address generating section, in a state in which issuance of said verifying operation execution signal to said verifying section is inhibited during said preprogramming operation period.

14. A non-volatile semiconductor memory device according to claim 13, wherein said period detecting section includes a flip-flop circuit which is set in response to said address generation start signal and reset in response to said address end signal.

15. A non-volatile semiconductor memory device according to claim 13, where said control section includes:

a first section for issuing said address generation signal to said address generating section and said preprogramming operation period detecting section in response to an initialize instruction; and
a second section for issuing said address update signal to said address generating section during said preprogramming operation period.

16. A non-volatile semiconductor memory device according to claim 13, wherein said period detecting section includes a section for detecting a verifying operation period subsequent to said preprogramming operation period in response to said address generation start signal, and twice of said address end signal.

17. A non-volatile semiconductor memory device according to claim 16, wherein said control section further includes means for repeatedly issuing said verifying operation execution signal to said verifying section, while repeatedly issuing said address update signal to said address generating section, in a state in which issuance of said preprogramming operation execution signal to said writing section is inhibited during said verifying operation period.

18. A non-volatile semiconductor memory device according to claim 17, wherein said control section further includes means for issuing said preprogramming operation execution signal to said writing section without issuing said address update signal during said verifying operation period when said verifying operation result signal indicates that the verifying operation result is not good, and for issuing said verifying operation execution signal to said verifying section without issuing said address update signal to said address generating section in response to a preprogramming operation end signal from said writing section.

19. A non-volatile semiconductor memory device according to claim 18, wherein said control section includes:
an address update signal generating circuit for generating said address update signal in response to said verifying operation execution signal, and selectively stops the generation of said address update signal in response to said verifying operation result signal;
a first section for setting said verifying operation execution signal in response to said address update signal, and resetting said verifying operation execution signal in response to a verifying operation end signal from said verifying section, whereby said verifying operation execution signal is generated; and
a second section for setting a preprogramming operation execution signal in response to said verifying operation result signal and resetting said preprogramming operation execution signal in response to a preprogramming operation end signal from said writing section, whereby said preprogramming operation execution signal is generated.

* * * * *